United States Patent [19]

Caro, deceased

[11] Patent Number: 4,896,340
[45] Date of Patent: Jan. 23, 1990

[54] PARTIAL DIRECT INJECTION FOR SIGNAL PROCESSING SYSTEM

[75] Inventor: David B. Caro, deceased, late of Redondo Beach, Calif., by Marilyn C. Kaminski, legal representative

[73] Assignee: Hughes Aircraft Company, Los Angeles, Calif.

[21] Appl. No.: 793,926

[22] Filed: Nov. 1, 1985

[51] Int. Cl.$^4$ ................. H01L 29/78; G11C 19/28
[52] U.S. Cl. ......................... 377/60; 377/58; 357/24; 357/30; 307/296.8
[58] Field of Search .................... 377/57–63; 307/491, 607, 493, 296.1–296.8; 357/24, 24 LR, 30, 51, 59; 358/213.15, 213.16, 213.18, 213.14, 213.31

[56] References Cited

U.S. PATENT DOCUMENTS

| | | | |
|---|---|---|---|
| 3,488,528 | 1/1970 | Emand | 377/57 |
| 3,660,697 | 5/1972 | Berglund et al. | 377/63 |
| 4,093,872 | 6/1978 | Hartman et al. | 377/60 |
| 4,112,316 | 9/1978 | Wentz | 377/60 |
| 4,156,818 | 5/1979 | Collins et al. | 377/60 |
| 4,316,103 | 2/1982 | Nathanson | 377/60 |
| 4,574,384 | 3/1986 | Murata et al. | 377/58 |
| 4,590,390 | 5/1986 | Azques | 377/60 |
| 4,606,060 | 8/1986 | Klar et al. | 377/60 |
| 4,625,322 | 11/1986 | Tukazaki et al. | 377/58 |
| 4,727,560 | 2/1988 | Van Zanten et al. | 377/60 |

FOREIGN PATENT DOCUMENTS 0095797 5/1985 Japan ....................... 377/58

Primary Examiner—John S. Heyman
Assistant Examiner—Tai V. Duong
Attorney, Agent, or Firm—William J. Streeter; Wanda K. Denson-Low

[57] ABSTRACT

An interface structure (14) for an hybrid infrared charge coupled device (10) or other signal processing system provides for partial direct injection of the output current of an incorporated detector (12) or other signal source into the incorporated CCD (11). The remaining output current is bypassed through a load resistor ($R_L$) to a load voltage source ($V_L$). An injection path resistor ($R_I$) can be included to provide a voltage near the input threshhold bias of the CCD so that it operates in its linear region even at low detector outputs. The disclosed resistors can be conveniently fabricated using an additional polysilicon layer on either the detector or the CCD.

The disclosed interface structure makes effective use of the limited charge-handling capability of the CCD. It also makes possible the operation of the detector in an inverted mode to avoid saturation by bright scene objects. In addition, the higher available detector bias reduces crosstalk between detector elements.

7 Claims, 3 Drawing Sheets

PARTIAL DIRECT INJECTION FOR SIGNAL PROCESSING SYSTEM

The invention herein described was made in the course of or under a Contract or Subcontract thereunder with the U.S. Government.

BACKGROUND OF THE INVENTION

The present invention relates to signal processing systems, for example, hybrid infrared charge-coupled devices. More particularly, this invention relates to an interface structure between a signal processor and an associated signal source. In many contexts, there is a problem matching a signal to be processed with the characteristics of the device selected to process that signal. As a case in point, the performance of a state-of-the-art hybrid infrared charge-coupled device (IRCCD) is limited by the charge handling capacity of the incorporated charge-coupled device (CCD). This limitation proves to be a major obstacle in approaching performance goals such as background-limited performance (BLIP), which refers to a signal-to-noise ratio (S/N) limited to that inherent in the scene being viewed.

A hybrid IRCCD comprises two integrated circuits which are fabricated separately, then physically and electrically connected. One of these integrated circuits constitutes a detector array and a CCD. The detector array can include thousands of detector elements each adapted for providing a time-varying output as a function of incident infrared radiation. In many IRCCDs, each detector element output is directly injected into a CCD input where it is converted into packets of electric charge for storage and processing. For example, the CCD can combine, compare and multiplex the detector outputs, depending on the application. Operationally, a CCD controls local electric fields to transfer charge and to effect the storage of such charge in "potential wells", also referred to more quaintly as "charge buckets". These charge buckets, like their liquid bearing counterparts, have limited capacity. This capacity can be exceeded by an excessive current at a CCD input, or by the internal combination the contents of two partially full potential wells. The combination of the two packages results in a saturation condition. From a system point of view, exceeding the capacity of the potential wells results in elimination of the signal.

The limited charge-handling capacity makes it impractical to use the direct injection input structure with photovoltaic detectors in the long wavelength region. With photoconductive detectors, the bias could be lowered, but this would imply a lower photoconductive gain, a smaller signal, and, therefore, a decreased signal-to-noise ratio. Instead of injecting detector current into the CCD, a gate modulation approach uses the detector current to generate a variable voltage at a CCD transfer gate to modulate a current induced by a constant voltage source. This approach does result in a better match to the CCD's charge handling capacity without unduly sacrificing sensitivity or S/N. However, this requires in addition to a contact at the injection input, a contact at a gate input. The additional closely-spaced input requires greater process complexity, a larger area per input, and, thus, a lower process yield. It is found that the gate modulation input is susceptible to non-uniformities due to input threshhold variations.

What is needed is a practical signal processor interface structure which allows better use of the charge capacity of the signal processor without an offsetting decrease in sensitivity. In the context of hybrid IRCCDs and other CCD-based devices, the structure avoid unduly complicating the manufacture of the CCD which already strains the limits of processing technology.

SUMMARY OF THE INVENTION

In accordance with the present invention, a signal processing system includes a signal source, a signal processor, and an interface structure that provides for partial direct injection of the source output into the processor; the portion of the source output not injected can be suppressed or bypassed, for example, to a voltage source through a load path. The interface is designed to bypass a constant DC component of the current, while injecting most of the time-varying component into the processor. Thus, the signal processor storage capacity is freed to manage a wider range of signal variations, while essentially maintaining full sensitivity. In applications where it is the signal changes that are of interest, this approach efficiently uses the processor's charge handling capabilities.

An injection resistance can be included between the detector output and the processor input and between the load resistance and the processor input. This injection resistance linearizes the effect of the input transimpedance and decreases the non-uniform effect of the threshhold variations. Thus, for example, the voltage at the processor inputs can establish a threshhold current to maintain the CCD MOSFETs (metal on silicon field effect transistors) in their linear regions.

The bias voltage can be selected to substantially offset the DC component of the detector output, to partially offset the DC component, or to reverse the direction of the DC component. By substantially offsetting the DC component, the majority of the CCD charge-handling capacity can be devoted to processing signal changes. However, in some signal processing systems, a substantial offset adversely affects other parameters, so a partial offset is preferred as a compromise. Reversing the direction of the DC component allows the system to operate in an inverted mode. For example, in its inverted mode a hybrid IRCCD outputs a lower current in response to a brighter scene object. This avoids saturation and blooming problems that can occur when bright objects are viewed in the normal mode of operation.

Where the signal processor is largely constituted by integrated circuits, such as is the case with a hybrid IRCCD, the required resistances can be fabricated as part of the ICs. In some cases, it is advantageous to fabricate the resistors on a signal source integrated circuit. However, where this is not practical, the resistances can be fabricated on the CCD. In some embodiments, the resistances take the form of lightly-doped strips of polysilicon.

Thus, the present invention provides for better matching of the capacity of the CCD by bypassing or suppressing uninteresting components of the signal between the source output and the processor input. Thus, partial direct injection realizes greater dynamic range than the direct injection, and yet does not impose the processing obstacles of the gate modulation approach. When operating in the inverted mode, the hybrid IRCCD is protected from saturation and blooming while imaging very hot objects. As it turns out, partial direct injection permits the use of a greater detector bias resulting in less crosstalk between detectors.

DESCRIPTION OF THE PREFERRED EMBODIMENTS

Figure 1:
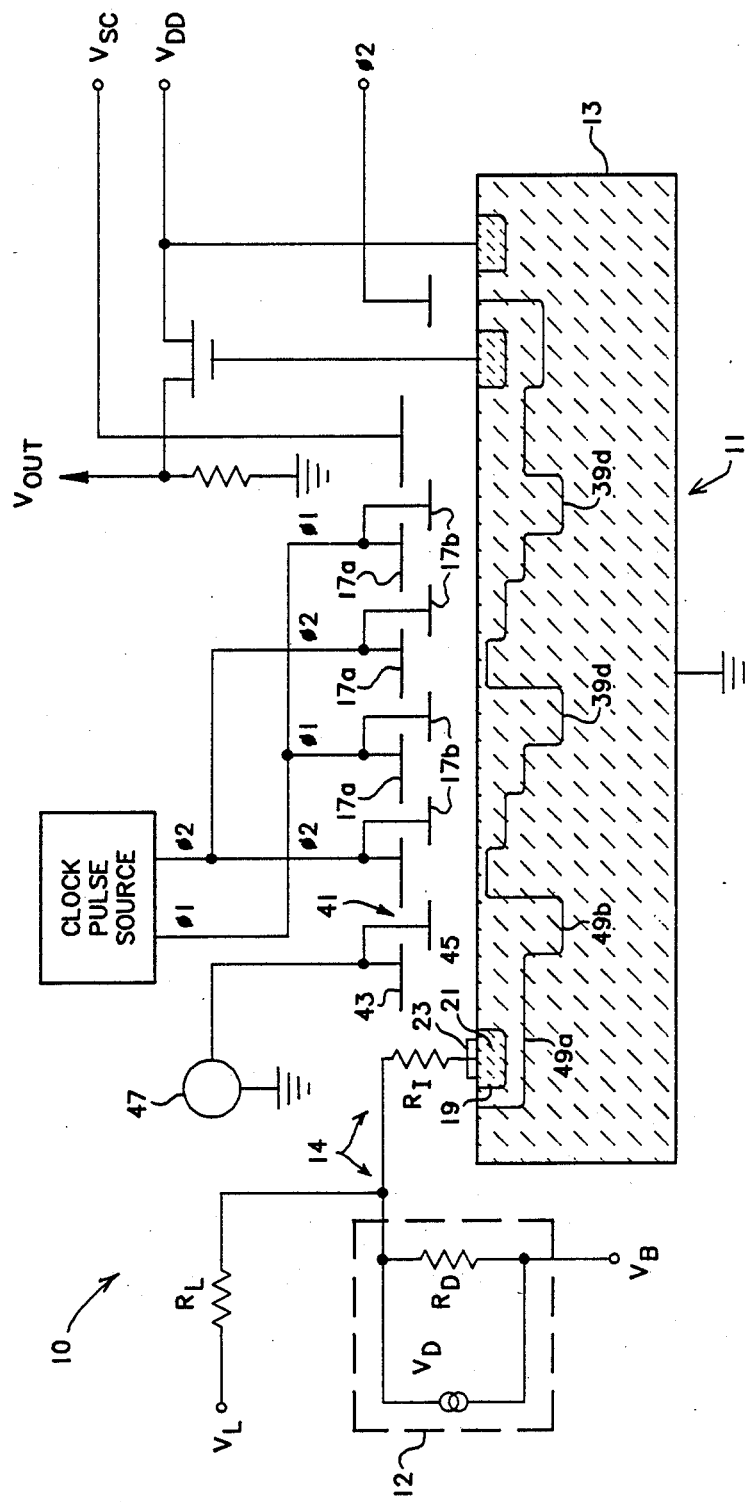
FIG. 1 is a schematic of a charge-coupled device and an injection circuit in accordance with the present invention.

A signal processing system 10 includes a CCD 11 or other signal processor, an infrared detector 12 or other signal source, and an interface structure 14, as shown in FIG. 1. In accordance with the present invention the interface structure 14 provides for the partial direct injection of a detector output current into an injection input 19 of the CCD 11, and provides for bypassing the remaining output current through a load $R_L$ to a voltage source $V_L$. An injection path resistance $R_I$ can be included to linearize the input voltage and make it less dependent on variations of the input 19 so that the CCD operates in its linear region even at low detector output levels.

The effect of this arrangement is to inject most of the AC component of the detector output and suppress or dump most of the DC component of the detector output. The result is that the sensitivity of the system 10 is increased and the dynamic range is greatly expanded relative to the direct injection approach.

Referring in greater detail to FIG. 1, near one electrode 17 of the CCD 11 is an injecting junction 19 formed by a diffusion 21 in the semiconductor substrate 13. Charges are injected through the junction 19 by a metal contact 23 on top of the diffusion 21.

The illustrated detector 12 is a photovoltaic detector, the equivalent circuit of which includes a voltage source $V_D$ shunted by a resistance $R_D$. The detector 12 is biased by a voltage $V_B$. It should be noted that while only one output 20 and one input 19 are shown in FIG. 1, in practice a single IRCCD can include thousands of detector-interface-processor paths arranged in a two-dimensional array. A potential well 49b is schematically represented beneath a storage portion 45 of an input electrode 41. It is the capacity of this well 49b and similar storage wells 39d that determine the charge handling ability of the CCD. A shallower potential well 49a beneath a transfer gate 43 of the input electrode 41 facilitates the transfer of charge from the diffusion 21 to the storage well 49b. The remaining structure and operation of the illustrated CCD 11 is disclosed in U.S. Pat. No. 4,093,872 to Hartman et al., particularly in the description pertaining to FIG. 5.

A typical prior art detector has the following structure: a substrate of a photosensitive material such as Si:Ga, or HgCdTe; an insulating layer, for example, of $SiO_2$; an aluminum or other metal layer for forming internal contacts through vias to the substrate and for forming external contacts; and a passivation layer, which can be of $SiO_2$. In a hybrid device, conductive bumps, which may be of indium, can be deposited on the external metal contacts; the bumps join with corresponding bumps on the CCD to provide electrical paths between the hybridized ICs.

Figure 2:
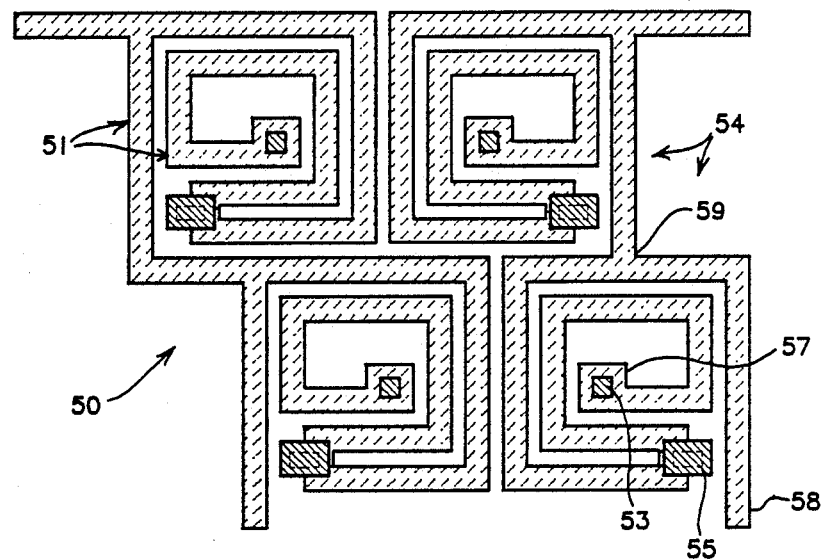
FIG. 2 is a plan view of a polysilicon resist layout on a detector integrated circuit in accordance with the present invention.

In a double resistor embodiment 50 of the present invention, a polysilicon layer 51, the layout for which is illustrated in FIG. 2, is deposited on the first insulating layer and prior to the metal layer. The polysilicon layer 51 is followed by a second insulating layer. Vias 53 and 55 are then formed to allow for the necessary contacts between the substrate, the polysilicon layer 51 and the metal layer. Metal is deposited to form internal connections by filling the vias 53 and 55 and to form external contacts. Finally, a passivation layer and indium bumps are added.

The polysilicon layer 51 constitutes three elements of each interface structure 54: a load bus 58, a load resistor $R_L$, and an injection path resistor $R_I$. In this example, the injection path resistor $R_I$ extends in a spiral configuration from the base of a polysilicon-to-metal two-level via 53 to a substrate-polysilicon-metal three-level via 55 which functions to electrically connect the substrate to the polysilicon layer 51. The polysilicon defining the load resistor $R_L$ extends from the three-level via 55 to a junction 59 with the bus 58.

The two resistors $R_L$ and $R_I$ and the bus 58 are formed integrally, in this embodiment 50. The polysilicon layer 51 is originally lightly-doped to provide a resistive characteristic. Subsequently, the resistor regions are masked and the remaining polysilicon is heavily doped to attain high-conductivity throughout the bus 58.

Figure 3:
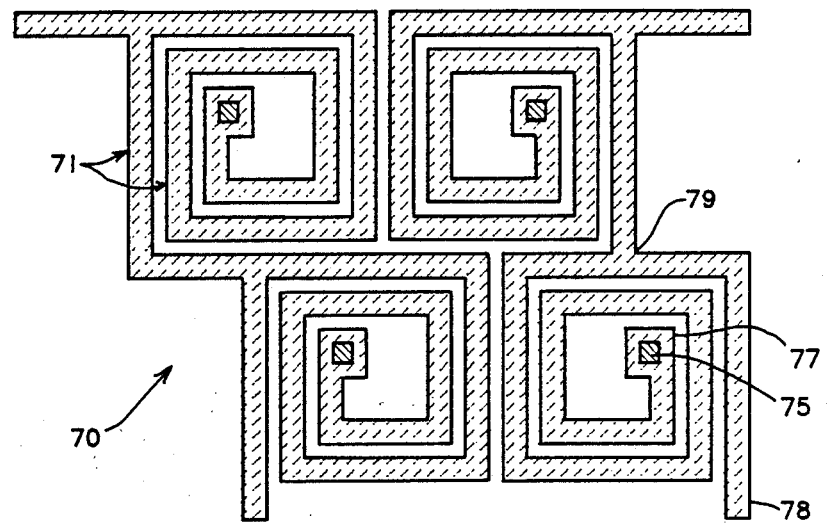
FIG. 3 is a plan view of another polysilicon resist layout on a detector integrated circuit in accordance with the present invention.

In a single resistor embodiment 70, a polysilicon layer 71 is added to a detector to define a load bus 78 and a load resistor $R_L$, as illustrated in FIG. 3. In this embodiment 70, system parameters are maintained within operating ranges without an injection path resistor. Except for the layout pattern of the polysilicon and the location of contacts, the processing for this embodiment 70 is the same as for the embodiment 50 of FIG. 2. The resistors $R_L$ merge with the load buses 78 at junctions 79. Again, these junctions 79 merely define the boundary between lightly and highly doped polysilicon. The resistors spiral inward and terminate in broadened ends 77 which contact three-level vias 75 to form electrical connections with the substrate and the external metal contacts.

In an alternative single resistor embodiment 80 of the present invention, a layer of insulator and a layer of polysilicon 81 are added to a standard CCD. This approach is applicable to hybrids with HgCdTe detectors, or with other detector materials which would not readily accept a polysilicon processing step.

Figure 4:
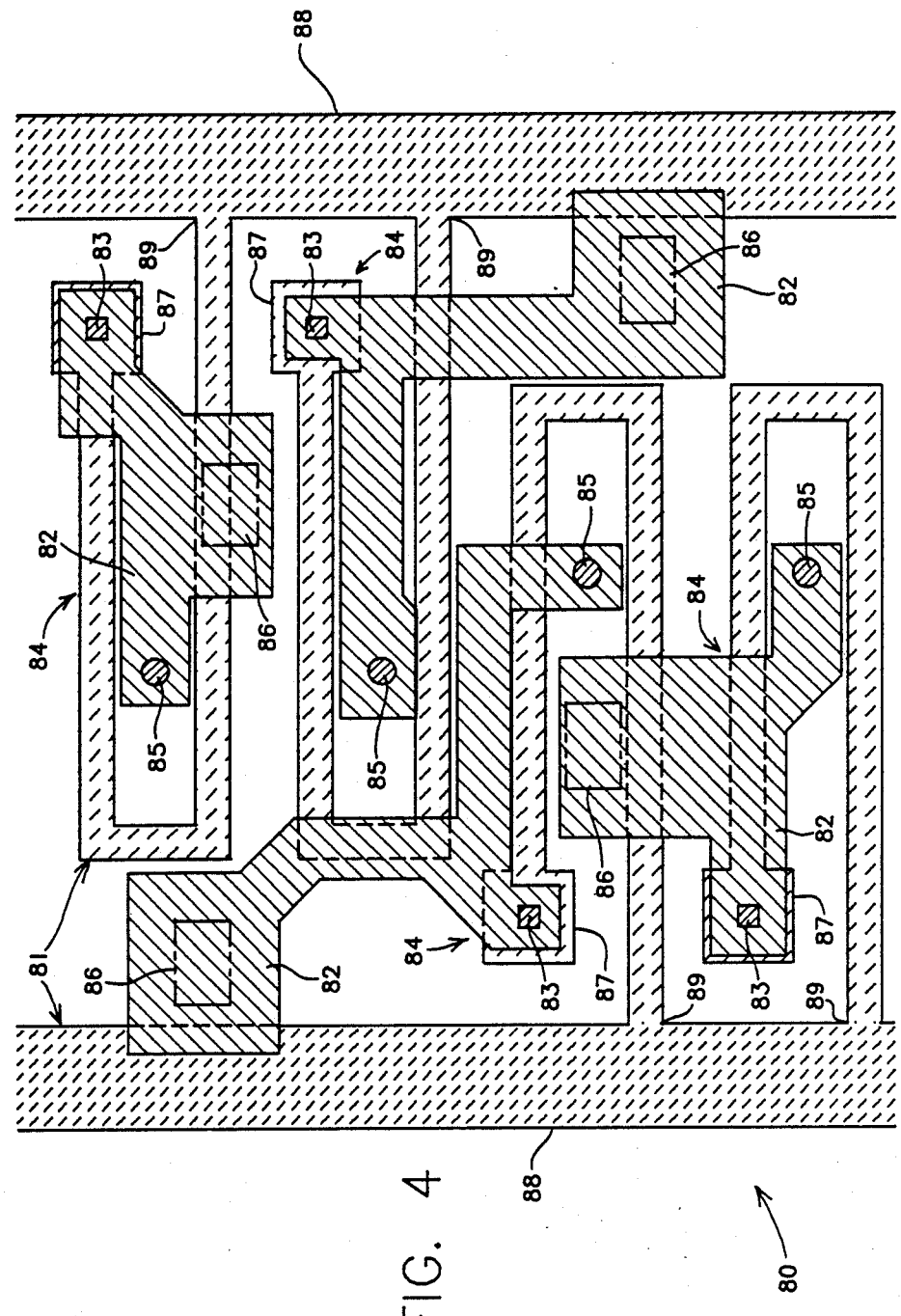
FIG. 4 is a plan view of a polysilicon resist layout on a CCD in accordance with the present invention.

The polysilicon layer 81 and the metal formations 82 for this embodiment 80 are illustrated in FIG. 4. As with FIGS. 2 and 3, four input structures 84 are represented. The locations of injection vias 85 are indicated for each metal formation 82, as are the external contact regions 86 for indium bumps which contact similar indium bumps on the detector upon hybridization. Two-level vias 83 electrically connect each metal formation 82 with a corresponding load resistor $R_L$ at the latter's broadened end 87. The opposite end of each resistor $R_L$ merges with a load bus 88 at a junction 89. The buses 88 are thicker and more heavily doped than the resistors $R_L$ to provide higher conductivity.

In the partial direct injection approach, unwanted DC current is removed by providing a parallel path for the current to flow away from the input. The amount of DC current injected into the CCD depends essentially on the nc bias of the input. The amount of signal and noise injected into the input is a function of $R_D$, $R_L$ and $g_m$, the transconductance of the input. In practice, 80% to 90% percent of the signal and noise can be injected while similar proportions of the DC component are rejected and removed through the load resistance $R_L$.

A theoretical analysis of the input gain equation indicates that an AC gain of somewhat less than one results when the inverse of the input transconductance is much less than the parallel sum of the detector resistance and the load resistance:

$$1/g_m < R_d \| R_L$$

The small AC loss is offset by an increased photoconductive gain in the detector, resulting in a net AC gain for the partial direct injection approach versus the direct injection approach. The circuit's DC suppression is achieved by selection of the DC node voltage to be near the input MOSFET's threshhold bias.

The values of the load voltages, resistances and other parameters can vary according to the type of signal processing system involved and the intended application. Using the teachings above, it is within the ken of skilled signal processing systems designers to determine advantageous parameters for their objectives. Generally, procedures for translating chosen parameters into layout forms and dimensions, doping levels and processing procedures for integrated circuits are well-known.

The present invention is applicable to visible light and other wavelength detectors, as well as infrared detectors. Similarly, a wide variety of detector formats and materials is contemplated. The signal processors can be monolithic or discrete devices, as well as hybrid. While the load voltage is treated herein as constant, it is clear that the load voltage can be varied slowly with respect to imaging time to compensate for varying noise background, induced, for example, by changes in the ambient temperature. The resistances can be implemented together or separately. The resistances can be imposed by regions of polysilicon, or thin film, formed into strips or other shapes. The strips can be straight, angular and/or curved. Alternatively, the resistive loads can be effected by MOSFETs. It is also possible to create the resistances by using detector material shielded from photon sources.

The signal processor can implement a variety of functions, such as multiplexing, combination, and comparison. The signal processor can be a direct readout register instead of a CCD.

Thus, in accordance with the present invention, an improved interface structure and incorporating signal processing system are provided. The capacity range of the signal processor is better matched by bypassing or suppressing uninteresting components of the signal between the source output and the processor input. This approach offers greater dynamic range than the direct injection approach and more ready fabrication than the gate modulation approach. Also, the use of higher detector bias by the present invention results in stronger delineation of the pixel shape in the detector array. Finally, the running of the PDI input circuit in the inverted mode protects the CCD input from saturation and blooming while imaging scenes bright enough to saturate a direct injection system or a partial direct injection system operating in the normal mode.

The illustrated embodiments are merely suggestive of the range of applications provided by the present invention. Other detector materials and circuit structures are possible. Accordingly, the present invention is subject to many variations and modifications and its scope is limited only by the following claims.

What is claimed is:

1. A signal processing system comprising:
   a signal source having an output for providing a time-varying current having a DC component and a time-varying component;
   a signal processor having an input for receiving a time varying current; and
   an interface circuit connected between said signal source and signal processor input and including an injection path and an impedance means series connected between said signal processor input and said signal source output, for delivering a first part of said time-varying current to said signal processor input, and dc bias means shunt connected between said impedance means and said signal source output for diminishing said DC component relative to said time-varying component at said input of said signal processor.

2. The signal processing system of claim 1 further characterized in that said signal source is a detector integrated circuit, in that said signal processor is a signal processor integrated circuit, and in that said impedance means is integral with at least one of said integrated circuits.

3. The signal processing system of claim 1 further characterized in that said impedance means is an injection path resistance means in series electrically between said signal processor input and said signal source output and said dc bias means includes resistance means connected to said injection path resistance means.

4. The signal processing system of claim 3 further characterized in that said signal source is a detector integrated circuit and that said signal processor is a signal processor integrated circuit, and that said resistance means are integral with at least one of said integrated circuits.

5. A signal processing system comprising:
   a detector circuit having an output, said detector providing at said output a current as a function of the intensity of incident radiation within a predetermined frequency band;
   a signal processor integrated circuit including a current injection input;
   resistance means serially connecting said output with said current injection input;
   a voltage source; and
   a resistive load shunt connected between said voltage source and the connection between said resistance means and said output, said resistive load acting to shunt a predetermined dc portion of said detector output current from said current injection input, and said resistance means acting to adjust the level of current injection to said signal processor input.

6. The signal processing system of claim 5 further characterized in that said resistive load and said resistive means are collectively constituted by a polysilicon strip.

7. The signal processing system of claim 6 further characterized in that said resistive load is integral with said detector integrated circuit.

* * * * *